(12) United States Patent
Hovik

(10) Patent No.: US 8,699,227 B2
(45) Date of Patent: Apr. 15, 2014

(54) WELL LOGGING TOOL

(75) Inventor: Thomas Hovik, Drammen (NO)

(73) Assignee: Norwegian Well Solutions AS, Drammen (NO)

( * ) Notice: Subject to any disclaimer, the term of this patent is extended or adjusted under 35 U.S.C. 154(b) by 0 days.

(21) Appl. No.: 13/816,936

(22) PCT Filed: Aug. 23, 2011

(86) PCT No.: PCT/NO2011/000231
§ 371 (c)(1),
(2), (4) Date: Feb. 14, 2013

(87) PCT Pub. No.: WO2012/026825
PCT Pub. Date: Mar. 1, 2012

(65) Prior Publication Data
US 2013/0148300 A1    Jun. 13, 2013

(30) Foreign Application Priority Data
Aug. 24, 2010  (NO) .................................. 20101185

(51) Int. Cl.
| H05K 7/20 | (2006.01) |
| F28F 7/00 | (2006.01) |
| E21B 36/00 | (2006.01) |
| G01V 5/04 | (2006.01) |

(52) U.S. Cl.
USPC .......... 361/710; 361/700; 361/715; 165/80.2; 165/80.4; 165/104.33; 174/15.2; 174/548; 166/302; 166/57; 166/66; 250/261

(58) Field of Classification Search
USPC ......... 361/679.46–679.54, 688–723; 250/261
See application file for complete search history.

(56) References Cited

U.S. PATENT DOCUMENTS

| 3,859,523 | A | * | 1/1975 | Wilson et al. ................. 250/261 |
| 3,957,107 | A | * | 5/1976 | Altoz et al. .................... 165/276 |
| 4,315,417 | A | | 2/1982 | Zarudiansky |
| 4,375,157 | A | * | 3/1983 | Boesen ........................... 62/49.2 |
| 4,407,136 | A | * | 10/1983 | de Kanter .......................... 62/64 |
| 4,440,219 | A | * | 4/1984 | Engelder ......................... 166/57 |
| 4,559,790 | A | | 12/1985 | Houston |
| 4,610,299 | A | * | 9/1986 | Hoover ......................... 165/80.2 |
| 4,629,888 | A | | 12/1986 | Wolk |
| 5,931,000 | A | * | 8/1999 | Turner et al. ..................... 62/3.2 |
| 7,440,283 | B1 | | 10/2008 | Rafie |
| 7,921,913 | B2 | * | 4/2011 | Tchakarov et al. ........... 166/302 |
| 2005/0097911 | A1 | | 5/2005 | Revellat |
| 2005/0284613 | A1 | | 12/2005 | Gunnawardana |
| 2006/0117759 | A1 | | 6/2006 | Hall |
| 2008/0148814 | A1 | | 6/2008 | Bostrom |

* cited by examiner

Primary Examiner — Zachary M Pape
(74) Attorney, Agent, or Firm — Christian D. Abel

(57) ABSTRACT

The present invention relates to a device for transfer of heat energy in a well logging tool, where a variable heat flow from a chamber for electronics via a thermovalve is transmitted into a heat sink consisting of cooled metal, thereby establishing an approximately constant temperature in the chamber for electronics. The device comprises an electronics modular unit and a heat sink modular unit, which modular units are connected via an intermediate section, where a heat-regulating thermovalve provides heat conduction between a conical piston and a conical piston seat, for transferring heat energy.

5 Claims, 1 Drawing Sheet

WELL LOGGING TOOL

Figure 1:
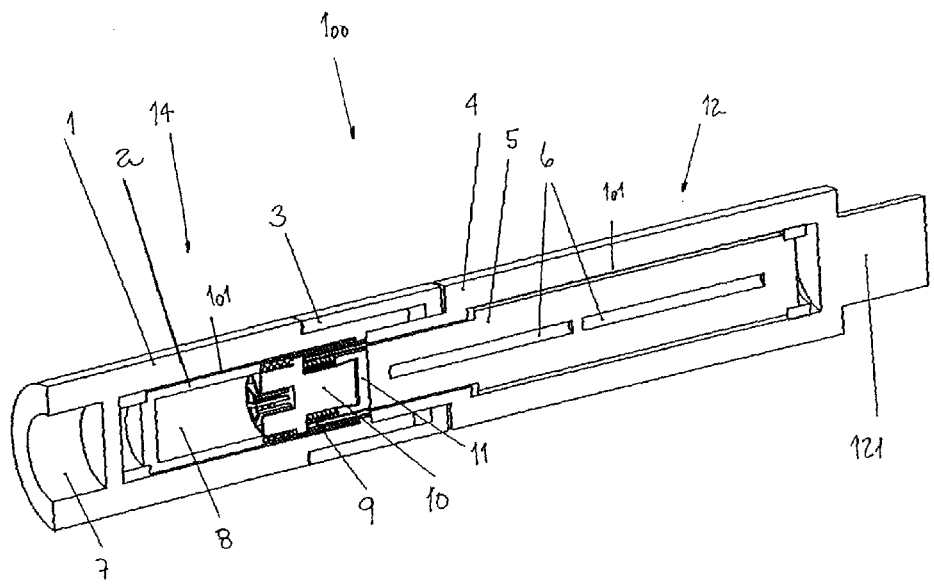

The present invention relates to a device for transferring heat energy in a well logging tool, where cooled metal in the well logging tool is employed as a heat sink and where vacuum insulation (multi-Dewar flask) prevents heat transport from the environment into the well logging tool containing the heat sink.

Various well logging techniques are known within the field of exploration and production of hydrocarbons. These involve use of a so-called well logging tool, which is connected to a wireline, into a well or borehole in order to "measure" the properties of the formation and/or the fluid. The well logging tool will be equipped with sources which are arranged to transmit energy. The transmitted energy interacts with the surrounding formation and/or fluid in order to generate signals which are detected and measured by one or more sensors on the well logging tool or "probe". By processing the detected signal data, a profile can be derived of the properties of the formation or the fluid.

In connection with the use of the above-mentioned well logging tools or "probes" for diagnosing the well's characteristics, such as pressure, temperature, formation properties in the subsurface rock, pipe conditions (corrosion and leaks) etc., the electronics in the well logging tool or "probe" have to be protected from the environment in a pressure-tight chamber. The well logging tool may receive energy (electric current) from one or more attached battery packs, or via one or more electrical connections in the actual wireline.

It is a well-known problem, however, that the electronics employed in such a well logging tool or "probe" is subjected to ambient temperatures in the well and self-generated heat energy. For low-temperature wells, electronics are available which function up to approximately 150° C. and at best up to 175° C. For medium to high-temperature wells it is difficult to design electronics which are capable of functioning satisfactorily over a longer period (>0 hours) for the desired purpose.

The present invention is based on the use of known technology within the field of heat sinks and the charging thereof, in order thereby to provide a passive cooling system for the electronics employed in a well logging tool.

A number of systems have been published for passive storage of heat energy by means of phase changes from solids to liquids and from liquids to gases, where a heat sink in a container is based on the molecules' binding energy. The common feature for systems of this type is that the temperature in the phase change is relatively stable, thereby enabling the heat regulation to be implemented by heat pipes. A problem for systems based on such phase changes is that if the heat sink is heated up, gases may be created and/or the gas(es) may become so hot that a pressure build-up arises inside the heat sink. This means that the container with the heat sink has to be constructed as a relatively large and robust structure so that the container will be able to withstand internal and external pressure. This may be a problem when a well logging tool is limited to have a small diameter.

There are also systems based on emission and an absorption cycle where the heat carrier is hydrogen molecules which are released from a low-temperature hybrid liquid, and which in turn are stored in a high-temperature metal hybrid so as to prevent pressure build-up inside the container.

There is a further known system which is based on active cooling circuits with liquid-to-gas phase and at a constant pressure. An example of this is a system based on water where the compressed gas (water vapour) is released into the well (Schlumberger 1996).

The above-mentioned systems are amongst those described in a publication issued by the Institute of Sensor and Actuator Systems (ISAS) with the following link: http://www.uni-stuttgart.de/izfm/aktuelles/veranstaltungen/Vortrag%206%20-0Matovic.pdf.

From the patented devices for heat expansion in metal (bimetal), we refer here to U.S. Pat. No. 6,305,174 B1, where actuation is based on heat expansion, thereby causing a concentric piston to be pushed towards a corresponding concentric cylinder.

U.S. Pat. No. 3,225,820 describes regulation of heat by means of heat conduction, where bimetal devices and gas/liquid structures push heat-conducting elements towards each other, thereby establishing a heat-conducting contact between the heat-conducting elements.

Heat conduction with heat pipes is a known principle from 1942, this principle being described in U.S. Pat. No. 2,350,348.

Another patent where this principle is employed is Schlumberger's U.S. Pat. No. 6,978,828 where heat transport is enabled by means of two heat pipes coupled in series for direct cooling of electronics with transmission of heat due to condensation in the end of heat pipe number two, which in turn is connected to a heat-absorbing appliance based on known active and passive devices.

The device for a well logging tool according to the present invention can be based on an expansion of a medium, i.e. a liquid or a gas, in order thereby to regulate a thermovalve. By employing a pressure change in a gas for activation of the thermovalve, the movement obtained in the thermovalve will be substantially greater than that obtained by employing heat expansion alone.

Furthermore, the device for a well logging tool according to the present invention will be based on transmission of heat along a heat pipe's entire length, where this is implemented by means of the thermovalve and not only through a heat-absorbing device arranged in one end of a heat pipe.

The device for a well logging tool will furthermore be based on the principle of heat storage and heat capacity in a metallic heat sink, which is characterised by the greatest possible heat capacity over a functional temperature range and which together with a thermovalve is capable of being regulated in order to achieve an approximately desired temperature in a chamber in a well logging tool, where the chamber contains the payload in form of electronics. The requirement for a variable modular heat sink which can be varied according to temperature conditions in the individual well and the desired operational time will therefore be more important factors in such a system.

Finally, the device for a well logging tool can be based on a regulation of a heat flow by means of a thermovalve which is activated by a gas arranged in the thermovalve. The above known devices for regulating heat energy are based on heat expansion (bimetal) or a liquid/wax mixture which expands, thereby causing a valve to be activated. The last-mentioned device is the dominant means for regulating cooling water temperature in vehicles.

An object of the present invention will therefore be to attempt to solve some of the above-mentioned problems or disadvantages of the prior art, together with providing a well logging tool which can operate within a greater time and temperature range.

The above objects are achieved with a system for transferring and storing heat energy in a well logging tool as indicated in the following independent claim, where further features of the invention will be apparent from the dependent claims and the description below.

The present invention relates to a device for transferring heat energy in a well logging tool, where cooled metal in the well logging tool is employed as a heat sink and where vacuum insulation (multi-Dewar flask) prevents heat transport from the environment into the well logging tool containing the heat sink.

The device for a well logging tool according to the present invention comprises a module with a metallic heat sink which is coupled to a module for electronics (payload) via a heat-regulating thermovalve, with a basis in heat conduction in gas and metal. The thermovalve is then filled with a gas (inert) and activated by means of a pressure change in the gas, whereby the thermovalve will provide heat conduction to the module with the heat sink, thereby causing the electronics in the well logging tool to be cooled to an approximately desired constant temperature over a wide temperature range by means of the heat conduction to the heat sink.

The heat sink consists primarily of a metal element and a surrounding housing, which may also contain at least one heat pipe if the desired utilisation period is greater than the metal can stand with regard to heat conduction relative to an amount of heat which is transmitted into the heat sink.

In an embodiment the heat-regulating thermovalve will be self-regulating, whereby during heating an increase will occur in the pressure of an inert gas contained in the thermovalve, this pressure change causing a heat-conducting conical piston to be pushed towards a complementarily formed conical seat. Before the heat-conducting conical piston comes into contact with the complementarily formed conical seat, the heat conduction in the heat-regulating thermovalve will be radiation between surfaces in the thermovalve and heat conduction in the inert gas. On contact between the conical piston and the complementarily formed conical seat, there will be heat transfer by conduction that provides the heat transport.

Transport of heat energy from electronics arranged in a chamber in the well logging tool to the heat-regulating thermovalve may be provided by means of heat conduction directly through a printed circuit board or via convection in the gas (air) inside the electronics module.

In an embodiment of the present invention the modules for electronics and heat sink may be insulated by a surrounding cavity under vacuum, where this design will prevent heat conduction between the external modules against the well, which external modules protect the interior or internal modules for electronics and heat sink (Dewar flask principle). Internal surfaces between the one or several external and internal module(s) may be coated with a highly reflective material, or they may be polished, thereby reducing heat transport due to radiation between these modules to a minimum. If the requirement for insulation is greater than the mutual heat radiation between the external modules' internal surfaces and the internal modules' external surfaces, the surrounding cavity between them may be provided with several coats of a reflective material, thereby reducing the total radiation relative to the number of reflective surfaces between the external and internal modules. In the literature this kind of insulation is called Multi Layer Insulation (MLI) and is a normal method of protecting satellites in space.

The device for a well logging tool according to the present invention may also comprise an additional thermovalve, where this thermovalve will be able to transfer heat out to the external module or modules if the temperature in the well/the external module or modules is lower than the desired temperature in the chamber in which the electronics are arranged.

By means of the device for a well logging tool according to the present invention, a passive cooling system is provided for the well logging tool's electronics, which can easily be set up (cooled) by means of known technology for charging a heat sink in the well logging tool. Furthermore, the device will be flexible with regard to load variations and desired operational time.

Other advantages and special features of the present invention will be apparent from the following detailed description, the attached drawings and the following claims.

Figure 2:
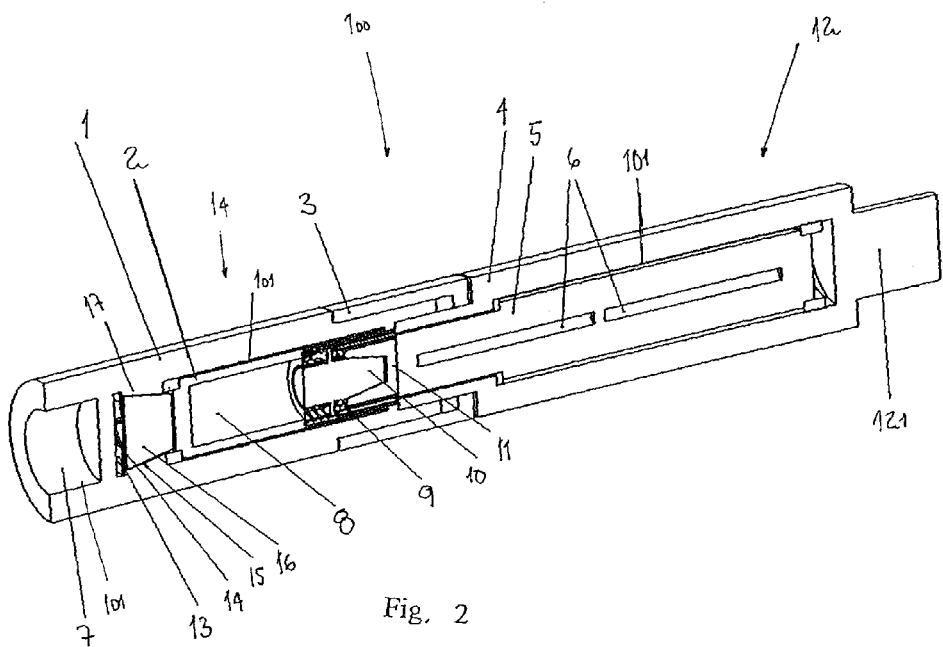

The invention will now be described in greater detail with reference to the following figures, in which FIG. 1 illustrates a cross section of a well logging tool, in which well logging tool a device for transferring heat energy according to the present invention is employed, and FIG. 2 illustrates a second embodiment of the device for transferring heat energy in a well logging tool according to FIG. 1.

In FIG. 1 a device 100 is illustrated for cooling electronics in a well logging tool, where the device 100 comprises a first section 1 and a second section 4, which first and second sections 1, 4 are interconnected via an intermediate section 3. When the sections 1, 3, 4 are assembled, they will form an outer housing (module) for the device 100.

The first section 1 is provided with a longitudinal bore, in which bore a hollow cylinder 2 is mounted. The hollow cylinder 2 is provided with a chamber 8 for electronics at one end, while a thermovalve 9, a heat-conducting conical piston 10 and a heat-conducting conical piston seat 11 are arranged at an opposite end of the chamber 8 for electronics. The first section 1, the chamber 8 for electronics, the thermovalve 9, the heat-conducting piston 10 and the piston seat 11 will together form an electronics modular unit 14. The thermovalve 9 and the heat-conducting conical piston 10 are interconnected in a suitable manner to each other.

One end of the first section 1, opposite an end which is connected to the intermediate section 3, will be provided with a recess 7, in which recess an electronics module (not shown) can be mounted.

The second section 4 is also provided with a longitudinal bore, in which bore an elongated metal element 5 is mounted. The elongated element 5 will furthermore be provided with heat pipes 6, which heat pipes 6 are arranged along and parallel to the elongated element's 5 longitudinal axis. The second section 4 and the elongated metal element 5 will together form a heat sink modular unit 12 in the device 100, where the heat sink modular unit 12 will act as a heat sink.

Furthermore, one end of the second section 4, opposite an end which is connected to the intermediate section 3, will be provided with an outwardly protruding portion 121.

The following is a typical regulation sequence for transfer of heat energy from the electronics arranged in the external chamber 8 to the heat sink modular unit 12, which will then act as a heat sink.

If a temperature in the chamber 8 for electronics is lower than a desired temperature, the thermovalve 9 will be in a closed position and there will therefore be no physical contact between the heat-conducting conical piston 10 and the complementarily formed heat-conducting conical piston seat 11. If the electronics arranged in the chamber 8 generate heat energy, this will lead to a temperature rise in the chamber 8 for electronics. This temperature will also affect the thermovalve 9, causing a pressure change to occur in the gas inside the thermovalve 9 on account of the change in temperature. When the temperature in the chamber 8 for electronics is greater than an activation temperature for the thermovalve 9, on account of the "opening" of the thermovalve 9, the conical piston 10 will be moved towards the conical piston seat 11, with the result that heat conduction is obtained between the conical piston 10 and the conical piston seat 11.

When heat conduction is established between the conical piston 10 and the conical seat 11, the heat energy will flow freely into the heat sink modular unit 12, which will then act as a heat sink. If the temperature in the gas inside the thermovalve 9 is cooled down to below the thermovalve's 9 activation temperature, thereby causing the gas pressure to drop, on account of the "closing" of the thermovalve 9, the conical piston 10 and the conical seat 11 will once again be separated, thereby stopping the heat flow.

In FIG. 2 a second embodiment of the device for storing heat energy in a well logging tool is illustrated, in which embodiment the device 100 comprises a first section 1 and a second section 4, which first and second sections 1, 4 are interconnected via an intermediate section 3. When the sections 1, 3, 4 are assembled, they will form an outer housing (module) for the device 100.

The first section 1 is provided with a longitudinal bore, in which bore a hollow cylinder 2 is mounted. The hollow cylinder 2 is provided with a chamber 8 for electronics at one end, while a first thermovalve 9, a heat-conducting piston 10 and a heat-conducting conical piston seat 11 are arranged at an opposite end of the chamber 8 for electronics.

Against one end of the hollow cylinder 2, i.e. the end housing the chamber 8 for electronics, a recess 17 is arranged in the first section 1, in which recess 17 a spiral spring 13, a bimetal element 24, a second thermovalve 15 and a heat-conducting conical piston 16 are arranged lying one behind the other.

In this embodiment of the device 100 for transfer of heat energy in a well logging tool the electronics modular unit 14 will therefore consist of the first section 1, the chamber 8 for electronics, the thermovalve 9, the heat-conducting piston 10, the piston seat 11, the spiral spring 13, the bimetal element 24, the second thermovalve 15 and the heat-conducting conical piston 16.

At one end, opposite an end which is connected to the intermediate section 3, the first section 1 will be provided with a recess 7, in which recess an electronic module (not shown) can be mounted.

In this embodiment of the device 100 for transfer of heat energy in a well logging tool, the heat sink modular unit 12 will be designed in a manner corresponding to the heat sink modular unit 12 in the embodiment illustrated in FIG. 1, and the heat sink modular unit 12 will therefore not be further described here.

The following is a typical regulation sequence for transfer of heat energy from electronics to well and from electronics to heat sink 5.

If a temperature in the well is lower than that set as activation temperature for the thermovalve 15, the heat-conducting conical piston 16 will be in physical contact with the hollow cylinder 2 and the first section 1, with the result that heat conduction is achieved between these two units 1, 2. If the temperature in the well increases so that the activation temperature of the second thermovalve 15 is obtained, the bimetal element 24 or gas (which then constitutes the actuation mechanism) will push the conical piston 16 towards the left in FIG. 2, thereby causing the direct heat conduction between the hollow cylinder 2 and the first section 1 to cease. The second thermovalve 15 is substantially controlled by the well temperature. When the second thermovalve 15 is not connected against the well, heat energy emitted from the electronics arranged in the chamber 8 will cause the temperature to rise, with the result that the thermovalve 9 takes over the regulation of the heat flow into the heat sink modular unit 12, in which case the heat sink modular unit 12 will act as a heat sink. How this regulation of the heat flow is carried out is described in connection with the embodiment illustrated in FIG. 1, and it will therefore not be repeated here.

If, however, the well temperature is reduced to below the activation temperature for the second thermovalve 15, the conical piston 16 will again come into physical contact with the hollow cylinder 2 and the first section 1, thereby causing heat conduction to be established between these two units 1, 2.

The thermovalve 9 will therefore be used for regulating the temperature in the chamber 8 for the electronics, with the result that a desired temperature is obtained in the chamber 8.

If the temperature gradient over the length of the heat sink modular unit 12 (the heat sink) is greater than desired, the distribution of the heat energy may be implemented by one or more frost-proof heat pipes 6, which will then distribute the temperature internally in the longitudinal direction of the heat sink modular unit 12.

Between the first section 1 and the hollow cylinder 2 and between the second section 4 and the elongated metal element 5 a cavity 101 is arranged, which cavity 101 will be under vacuum. This will cause the hollow cylinder 2 and the elongated metal element 5 to be thermally insulated from the first and the second sections 1, 4 respectively. The remaining heat transport is essentially due to radiation between the surfaces between the first section 1 and the hollow cylinder 2 and between the second section 4 and the elongated element 5 inside the cavity 101. If further insulation of the device 100 for transfer of heat energy in a well logging tool is required, the cavity 101 may be divided into several separate cavities which in turn increase the insulating effect in relation to the number of reflective surfaces that are between the outer and inner surfaces. This is known as "multilayer" insulation for heat radiation.

It should also be understood that the thermovalves 9, 15 activating temperature may be adapted to suit the existing well conditions, thereby permitting an approximately constant temperature to be achieved in the chamber 8 for electronics. A person skilled in the art will know how this should be done, and it will therefore not be described further here.

The electronics modular unit 14 and the heat sink modular unit 12 are releasably connected to the intermediate section 3, thereby enabling the two modules 12, 14 to be separated, for example in order to "charge" the heat sink, carry out maintenance or replace one of the modules 12, 14.

The invention has now been explained by several non-limiting embodiments. A person skilled in the art will appreciate that a number of variations and modifications may be implemented of the device for transferring heat energy in a well logging device as described within the scope of the invention as defined in the attached claims.

The invention claimed is:

1. A device (100) for cooling electronics in well logging tools, comprising an electronics modular unit (14) and a heat sink modular unit (12), wherein modular units (12, 14) are connected via an intermediate section (3), where a heat-regulating thermovalve (9), when a predetermined temperature is obtained, provides heat conduction between a conical piston (10) and a conical piston seat (11) for transfer of heat energy, thereby establishing a desired temperature in a chamber (8) for electronics.

2. A device according to claim 1,
   wherein a hollow cylinder (2) and an elongated element (5) are insulated from a first section (1) and a second section (4) via a cavity (101), with the result that heat conduction from the first and second sections (1, 4) respectively to the hollow cylinder (2) and the elongated element (5) is reduced to a minimum.

3. A device according to claim 2,
wherein the cavity (101) is divided into additional layered cavities, thereby increasing the total insulation for heat radiation.

4. A device according to claim 1,
wherein distribution of heat energy in the heat sink modular unit (12) is implemented by heat pipes (6), with the result that the temperature distribution along the longitudinal axis of the heat sink modular unit (12) is as homogeneous as possible.

5. A device according to claim 1,
wherein a second thermovalve (15) permits regulation of heat flow directly to the well, thereby preventing the heat sink modular unit (12) from being charged with heat energy when a well temperature is lower than that desired in the chamber (8) for electronics.

\* \* \* \* \*